(12) United States Patent
Durica et al.

(10) Patent No.: US 8,108,613 B2
(45) Date of Patent: *Jan. 31, 2012

(54) DETECTION AND RECOVERY OF DROPPED WRITES IN STORAGE DEVICES

(75) Inventors: William John Durica, Morgan Hill, CA (US); M. Amine Hajji, San Jose, CA (US); Joseph Smith Hyde, II, Tucson, AZ (US); Ronald J. Venturi, Winchester (GB)

(73) Assignee: International Business Machines Corporation, Armonk, NY (US)

( * ) Notice: Subject to any disclaimer, the term of this patent is extended or adjusted under 35 U.S.C. 154(b) by 977 days.

This patent is subject to a terminal disclaimer.

(21) Appl. No.: 11/950,321

(22) Filed: Dec. 4, 2007

(65) Prior Publication Data

US 2008/0091893 A1 Apr. 17, 2008

Related U.S. Application Data

(63) Continuation of application No. 11/053,226, filed on Feb. 7, 2005, now Pat. No. 7,360,112.

(51) Int. Cl.
*G06F 12/00* (2006.01)
(52) U.S. Cl. ......................... 711/133; 711/134
(58) Field of Classification Search .................. 711/133
See application file for complete search history.

(56) References Cited

U.S. PATENT DOCUMENTS

| | | | |
|---|---|---|---|
| 5,353,430 A | 10/1994 | Lautzenheiser | |
| 5,379,417 A | 1/1995 | Lui et al. | |
| 5,485,439 A * | 1/1996 | Hamasaka et al. | 369/47.36 |
| 5,557,770 A | 9/1996 | Bhide et al. | |
| 5,632,012 A | 5/1997 | Belsan et al. | |
| 5,845,326 A | 12/1998 | Hirayama et al. | |
| 6,412,045 B1 | 6/2002 | DeKoning et al. | |
| 6,584,589 B1 | 6/2003 | Perner et al. | |
| 6,658,533 B1 | 12/2003 | Bogin et al. | |
| 6,928,518 B2 | 8/2005 | Talagala | |
| 6,970,310 B2 | 11/2005 | Kawaguchi et al. | |
| 7,360,112 B2 | 4/2008 | Durica et al. | |
| 2003/0174562 A1 | 9/2003 | Kawaguchi et al. | |
| 2005/0154942 A1* | 7/2005 | Kano et al. | 714/43 |

(Continued)

FOREIGN PATENT DOCUMENTS

EP 0750259 B1 5/2002

(Continued)

OTHER PUBLICATIONS

Roger Kilday, John Felton, "Project Client Cache" [pp. 1, 4, 7, 9, 14, 15], Mar. 24, 2003.*

(Continued)

*Primary Examiner* — Tuan Thai
*Assistant Examiner* — Ngoc Dinh
(74) *Attorney, Agent, or Firm* — Rabindranath Dutta; Konrad Raynes and Victor LLP

(57) ABSTRACT

Provided are a method, system, and article of manufacture, wherein a request to write data to a storage medium is received. The data requested to be written to the storage medium is stored in a cache. A writing of the data is initiated to the storage medium. A periodic determination is made as to whether the stored data in the cache is the same as the data written to the storage medium.

14 Claims, 7 Drawing Sheets

U.S. PATENT DOCUMENTS

| | | | |
|---|---|---|---|
| 2006/0010173 A1* | 1/2006 | Kilday et al. | 707/200 |
| 2006/0098320 A1 | 5/2006 | Koga et al. | |
| 2006/0112306 A1 | 5/2006 | Chessin et al. | |
| 2006/0143399 A1* | 6/2006 | Petev et al. | 711/136 |
| 2007/0011414 A1 | 1/2007 | Nakayama et al. | |
| 2008/0307160 A1* | 12/2008 | Humlicek | 711/113 |

FOREIGN PATENT DOCUMENTS

| | | |
|---|---|---|
| JP | 4017020 | 1/1992 |
| JP | 7210327 | 8/1995 |
| JP | 2001142650 | 5/2001 |
| JP | 2003263703 | 9/2003 |
| WO | 9212482 | 7/1992 |

OTHER PUBLICATIONS

Patent Abstract for JP4017020, published Jan. 21, 1992, 1 pg.
Patent Abstract for JP7210327, published Aug. 11, 1995, 1 pg.
Patent Abstract for JP 2001142650, published May 25, 2001, 1 pg.
Patent Abstract and Machine Translation for JP2003263703, 34 pgs.
First Office Action for U.S. Appl. No. 11/053,226, dated Mar. 22, 2007, 9 pgs.
Notice of Allowance for U.S. Appl. No. 11/053,226, dated Sep. 4, 2007, 10 pgs.
Response to First Office Action for U.S. Appl. No. 11/053,226, dated Jun. 22, 2007, 12 pgs.

* cited by examiner

DETECTION AND RECOVERY OF DROPPED WRITES IN STORAGE DEVICES

CROSS-REFERENCE TO RELATED APPLICATIONS

This application is a continuation of application Ser. No. 11/053,226 filed on Feb. 7, 2005, which is incorporated herein by reference in its entirety.

BACKGROUND

1. Field

The disclosure relates to a method, system, and article of manufacture for the detection and recovery of dropped writes in storage devices.

2. Background

Write operations that write data to disk drives may fail intermittently or persistently. To detect such failures, certain drives use head read and write preamplification circuits that detect if the write current is below a certain threshold. The added complexity of the detection circuitry may present reliability problems. Additionally, the detection threshold setting may not ensure the detection of all write errors.

Certain implementations may attempt to detect that a disk drive has a dropped write problem by periodically moving the actuator to a reserved area of the disk, and subsequently writing and verifying what was written by each head. This verification of the writeability for all heads may be referred to as a persistent problem self test (PPST). This mechanism detects the dropped writes only if the write problem is persistent, i.e., the drive that is dropping writes continues to drop all subsequent writes involving the bad head(s). The PPST verification mechanism is not fully effective in detecting intermittent dropped writes. Additionally PPST verification does not allow the recovery of data that was not written due to the dropped writes between successive PPST writeability verifications. Furthermore, if the frequency of PPST verifications is increased to minimize the amount of data corruption, the input/output (I/O) performance may degrade to an unacceptable level.

In certain implementations, the PPST verifications may be augmented by retaining all of the writes in a cache between successive PPST verifications. If an erroneous write is detected the data is recovered directly from the cache. This mechanism does not protect against intermittent dropped writes, as intermitted dropped writes may not be detected by periodic checks of the heads. Furthermore, a fairly substantial and potentially expensive dedicated cache may be needed to reduce performance degradations due to the overhead of the PPST verifications. The cache needed to capture all of the writes increases with the increase in the time interval between the PPST verifications.

Certain implementations that provide protection against both intermittent and persistent dropped writes may perform write verification for each write operation, wherein each time a write is performed the disk drive completes a revolution and reads the just written data and compares the just written data to the data in the write buffer. While this guarantees no loss of data, it is adds to the latency of the drive, and the resulting I/O performance may be unacceptable.

SUMMARY OF THE DESCRIBED EMBODIMENTS

Provided are a method, system, and article of manufacture, wherein a request to write data to a storage medium is received. The data requested to be written to the storage medium is stored in a cache. A writing of the data is initiated to the storage medium. A periodic determination is made as to whether the stored data in the cache is the same as the data written to the storage medium.

In additional embodiments, the stored data is removed from the cache in response to determining that the stored data in the cache is the same as the data written to the storage medium.

In yet additional embodiments, the storage medium is write protected, in response to determining that the stored data in the cache is not the same as the data written to the storage medium. An error that indicates at least one dropped write to the storage medium is generated.

In further embodiments, the storage medium is a disk, wherein the cache is of a smaller storage capacity than the disk, wherein the data can be written more reliably to the cache in comparison to the disk, and wherein a host application reads unverified data from the cache and not from the storage medium.

In still further embodiments, a determination is made as to whether a number of entries in the cache exceeds a threshold, wherein the entries correspond to cached writes. Write addresses in the entries are coalesced to generate a list of the coalesced write addresses. The list of coalesced write addresses is ordered, wherein higher ordered coalesced write addresses are verified for write errors to the storage medium before lower ordered coalesced write addresses. In certain embodiments, exceeding the threshold indicates that the cache is over ten percent full.

In additional embodiments, a determination is made as to whether a number of entries in the cache exceeds a threshold, wherein the entries correspond to write addresses. A verification is made as to whether data corresponding to selected entries have been written without error to the storage medium. In certain embodiments, exceeding the threshold indicates that the cache is over ninety percent full. In other embodiments, the verifying is in response to determining that a comprehensive verification self test is enabled, and wherein if the comprehensive verification self test is not enabled then a persistent problem self test is performed.

In certain additional embodiments, writes to the storage medium are performed in one order, and verification of the writes to the storage medium are performed in a different order.

In yet additional embodiments, intermittent write errors are detected if the stored data in the cache is not the same as the data written to the storage medium. Additionally in certain embodiments, persistent write errors are also detected.

BRIEF DESCRIPTION OF THE DRAWINGS

Referring now to the drawings in which like reference numbers represent corresponding parts throughout.

DETAILED DESCRIPTION

In the following description, reference is made to the accompanying drawings which form a part hereof and which illustrate several embodiments. It is understood that other embodiments may be utilized and structural and operational changes may be made.

Certain embodiments allow recovery of data from a disk drive when the disk drive drops full block writes intermittently or persistently and fails to report the write errors.

Figure 1:
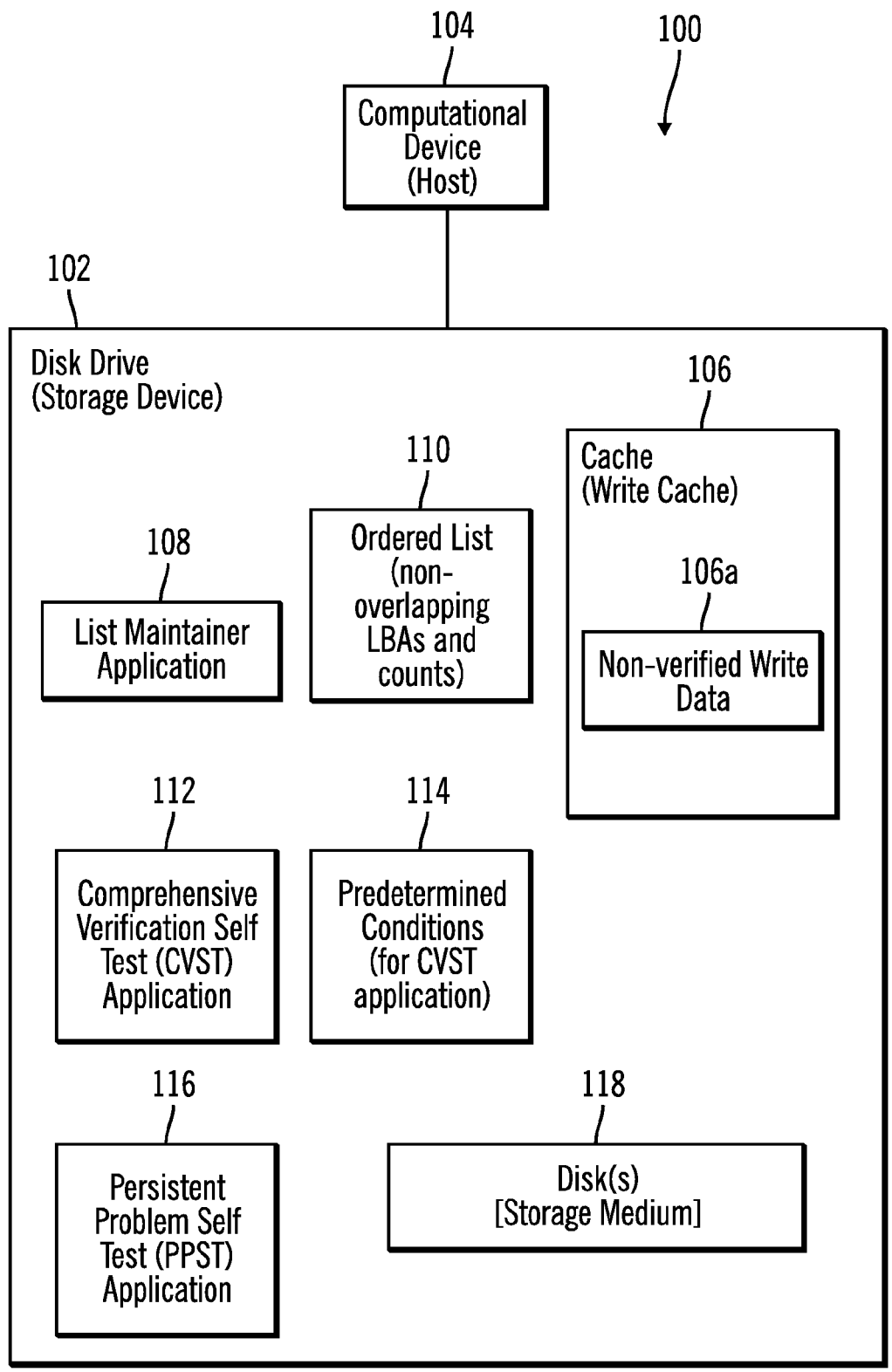
FIG. 1 illustrates a block diagram of a computing environment in accordance with certain embodiments.

FIG. 1 illustrates a block diagram of a computing environment 100 in accordance with certain embodiments. A storage device, such as, a disk drive 102 is coupled to a computational device 104, such as, a host computational device. The disk drive 102 may be coupled to the computational device either directly or via a network, such as, a storage area network (SAN), a local area network (LAN), an Intranet, the Internet, etc.

The computational device 104 may be any suitable computational device, including those presently known in the art, such as, a client, a storage server, a server, a personal computer, a workstation, a mainframe, a midrange computer, a network appliance, a palm top computer, a telephony device, a blade computer, a hand held computer, etc. While FIG. 1 shows a disk drive 102 as the storage device, in alternative embodiments, the storage device may be any other suitable device presently known in the art. The exemplary disk drive 102 may in certain embodiments be included in a Redundant Array of Independent Disk (RAID) array or may be included in Just a Bunch of Disks (JBOD).

The disk drive 102 may include a cache 106 that stores non-verified write data 106a, a list maintainer application 108 that maintains an ordered list 110 of non-overlapping logical block addresses and associated counts corresponding to entries stored in the cache 106, a comprehensive verification self test (CVST) application 112 that executes if one or more of a set of predetermined conditions 114 are satisfied, and a PPST application 116. The disk drive 102 may comprise one or more disks 118 to which data can be written.

The cache 106 may include any suitable non-volatile memory. In certain embodiments, writes on the cache are performed with a greater degree of reliability than writes on the disks 118. The non-verified write data 106a stored in the cache 106 is retained even in the event of a reset of the disk drive 102.

The list maintainer application 108, the CVST application 116, and the PPST application 116 may be implemented in software, firmware, hardware, or any combination thereof. The ordered list 110 and the predetermined conditions 114 may be stored in any suitable data structures.

In certain embodiments, when a write request is received at the disk drive 102 from the computational device 104, the data corresponding to the write request is stored in the cache 106. If there is any error in writing the data to the disk 118 then the CVST application 112 and/or the PPST application 116 can determine the error by comparing the data written to the disk 118 to the data stored in the cache 106.

Figure 2:
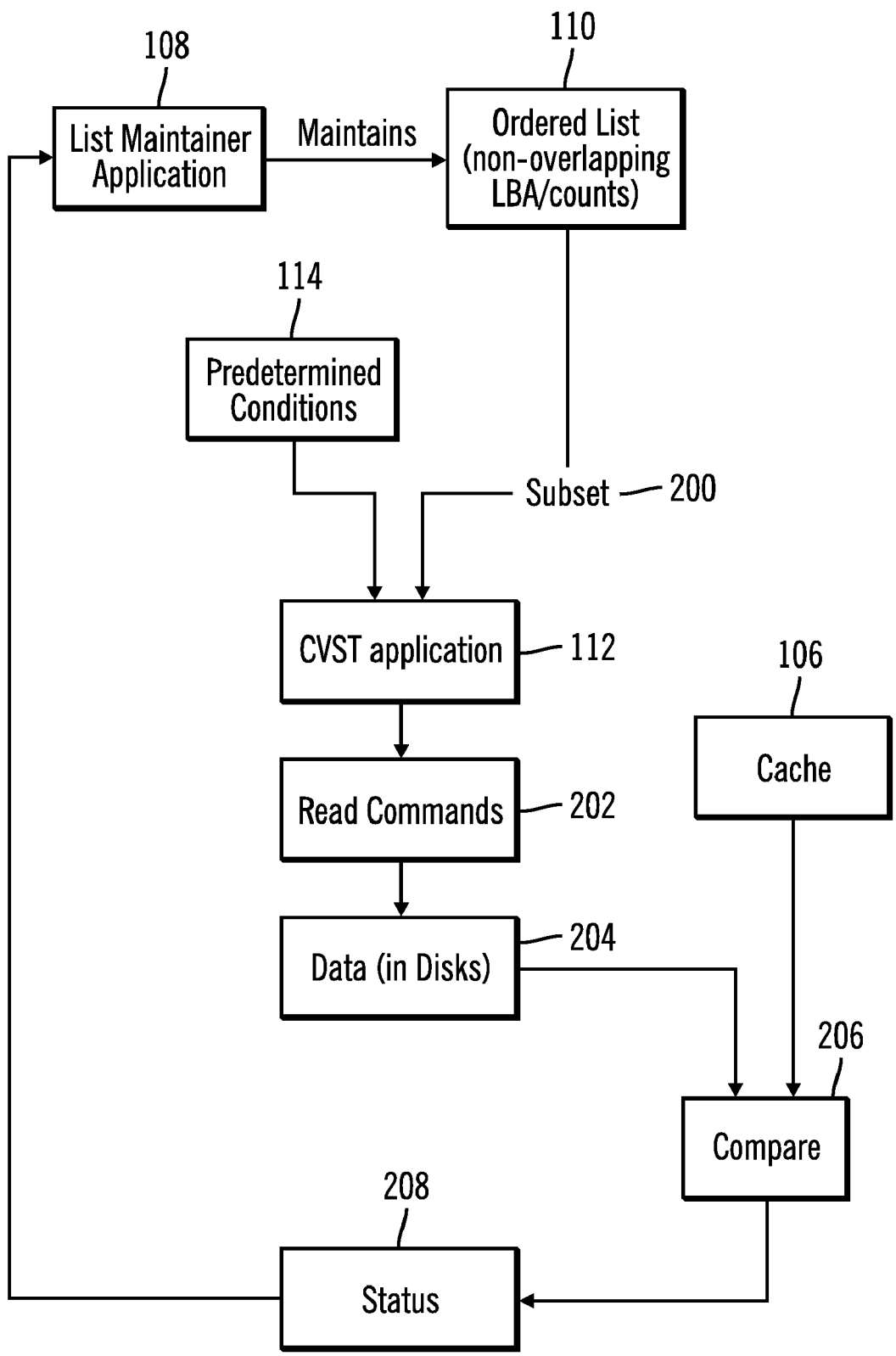
FIG. 2 illustrates a block diagram that shows components and data structures included in the computing environment, in accordance with certain embodiments.

FIG. 2 illustrates a block diagram that shows components and data structures included in the computing environment 100, in accordance with certain embodiments.

The list maintainer application 108 maintains the ordered list 110, where the ordered list 110 may comprise entries with non-overlapping logical block addresses (LBA) and associated counts. For example, an exemplary entry of the ordered list 110 may correspond to a write to logical block address=3 with count=4. This implies that data is written to four logical block addresses 3, 4, 5, and 6. There is no other entry in the ordered list 110 that includes the logical block addresses 3, 4, 5 or 6 since these logical block addresses 3, 4, 5, and 6 are already included in the exemplary entry. The list maintainer application 108 also orders the list 110 to improve the performance of reads from the disk drive 102.

When certain predetermined conditions 114 are satisfied the CVST application 112 may select a subset 200 of the ordered list 110 and issue corresponding read commands 202 to read data from the disks 118. In certain embodiments, the selected subset 200 may include the top 5% of entries in the ordered list 110. For example, if a selected entry in the subset 200 corresponds to logical block address=3 and count=4, then the CVST application 112 may issue a read command 202 for reading logical block addresses 3, 4, 5, 6 from the disks 118.

The data 204 stored in the disks 118, where the data 204 is a result of the executed read commands 202, is compared (reference numeral 206) to the data stored in the cache 106. A status 208 that indicates the result of the comparison may be generated for sending to the list maintainer application 108. For example, if the status 208 indicates that the data 204 in disks 118 matches the data in the cache 108, then the list maintainer application 108 may delete the corresponding entries in the ordered list 110 as the non-verified write data 106a corresponding to the deleted entries has been verified to be written correctly to the disks 118.

Therefore, FIG. 2 illustrates certain embodiments in which a list maintainer application 108 and a CVST application 112 verify data written to the disks 118 by comparing the data written to the disks 118 with data written to the cache 106.

Figure 3:
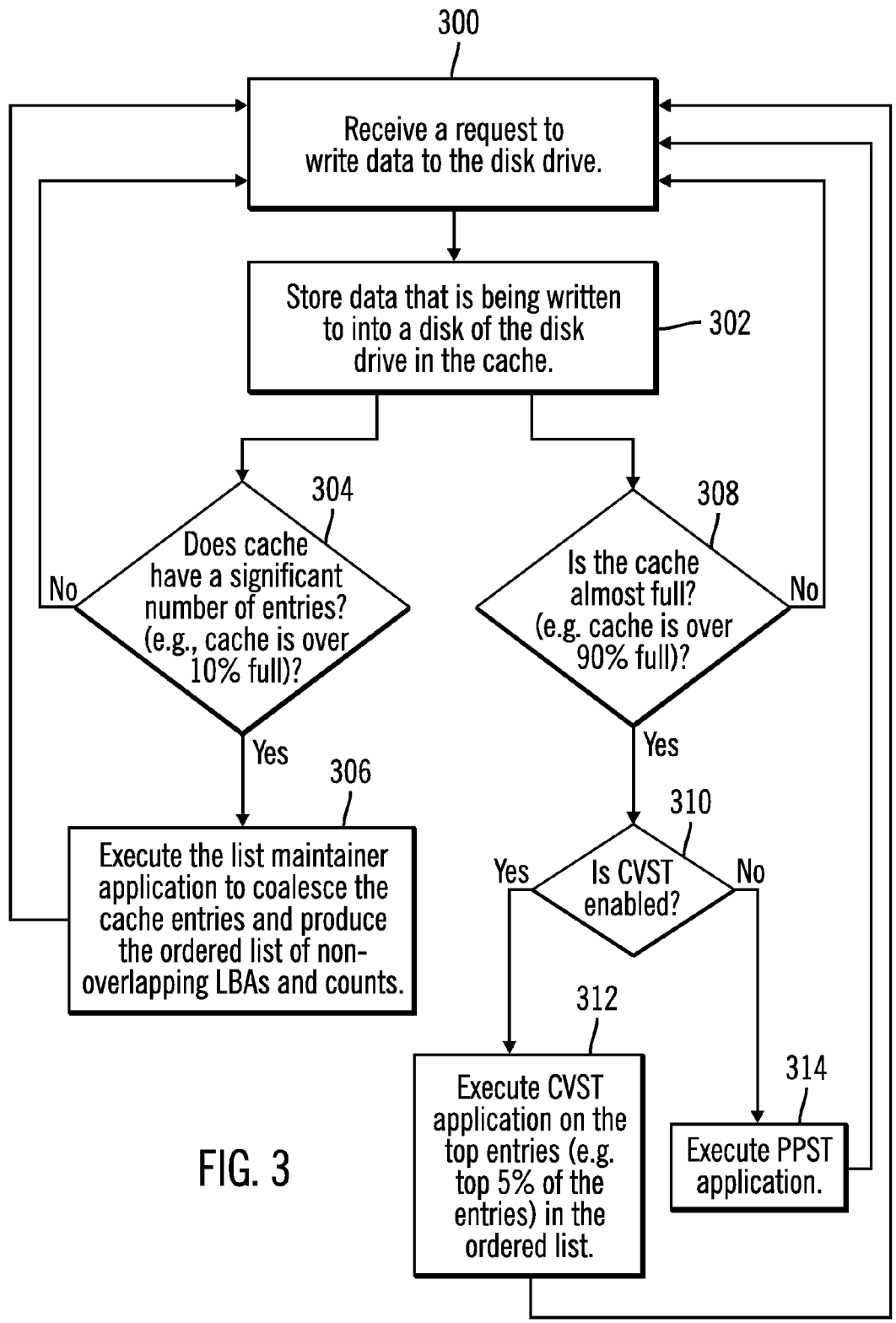
FIG. 3 illustrates operations for recovering from dropped writes, in accordance with certain embodiments.

FIG. 3 illustrates operations for recovering from dropped writes implemented in the disk drive 102, in accordance with certain embodiments.

Control starts at block 300, where a request is received to write data to the disks 118 of the disk drive 102. The disk drive 102 stores (at block 302) in the cache 106, the data corresponding to the write request, where the data is to be written to the disks 118. From block 302, control proceeds in parallel to blocks 304 and 308.

The disk drive 102 determines (at block 304) whether the cache 106 has a significant number of entries. In certain embodiments, the cache 106 may be considered to have a significant number of entries if the cache 106 is over 10% full. If so, then the disk drive 102 executes (at block 306) the list maintainer application 108 to coalesce the cache entries. The list maintainer application 108 may produce the ordered list 110 of non-overlapping logical block addresses and associated counts. Control then returns to block 300. If the cache 106 does not have a significant number of entries, then the disk drive 102 returns control to block 300 where the write requests are received.

The disk drive 102 determines (at block 308) whether the cache 106 is almost full. For example, in certain embodiments the cache 106 is considered to be almost full if the cache is over 90% full. The disk drive 102 determines (at block 310) whether CVST processing is enabled. If so, then the disk drive 102 executes (at block 312) the CVST application 112 on the selected entries in the ordered list 110. In certain embodiments, the selected entries may be the entries that have the highest order in the ordered list 110, e.g., the top 5% of the entries in the ordered list 110. Control returns to block 300 where new write requests are received. Control also returns to block 300, if the disk drive 102 determines (at block 308) that the cache 106 is not almost full.

If the disk drive 102 determines (at block 310) that CVST processing is not enabled, then the disk drive 102 executes (at block 314) the PPST application 116 immediately and control returns to block 300. The PPST application 116 can detect a persistent dropped write problem. In certain embodiments, CVST processing is not enabled because the detection of dropped writes only if the write problem is persistent is adequate in certain circumstances. In such embodiments, in which CVST processing is disabled, certain overheads of CVST processing may not be incurred.

In certain embodiments determining (at block 308) whether the cache is almost full and/or determining (at block 304) whether the cache has a significant number of entries may be implemented on the basis of comparisons with predetermined thresholds that in certain embodiments may indicate the fullness of the cache or the number of entries in the cache.

Therefore, FIG. 3 illustrates certain embodiments in which CVST application 112 executes when the cache is almost full. The CVST application 112 selects entries from the ordered list 110 for verification of writes to the disks 118, where the ordered list 110 may be managed actively by the list maintainer application 108 when the number of entries in the cache 106 exceeds a predefined threshold.

Figure 4:
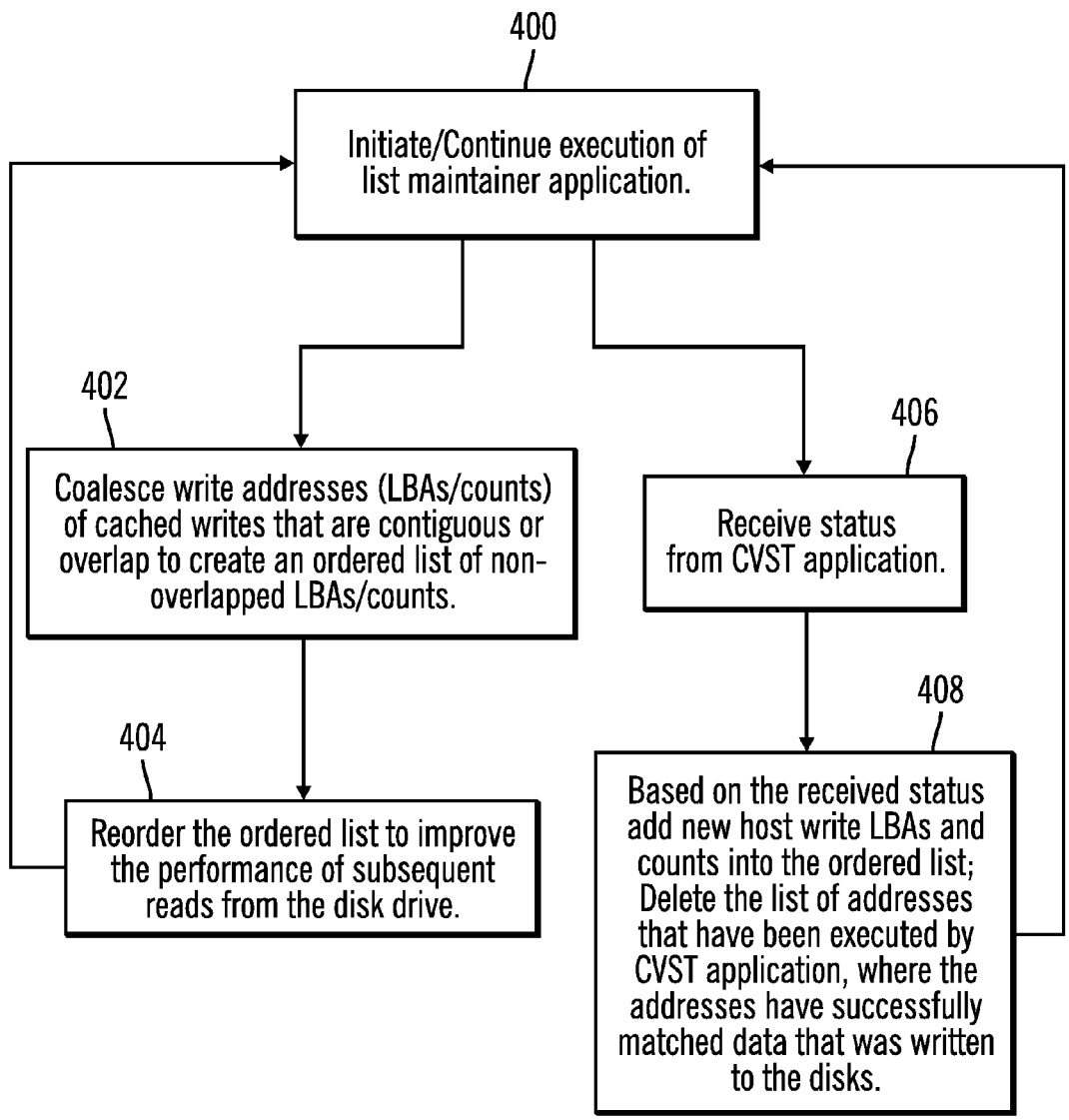
FIG. 4 illustrates operations implemented in a list maintainer application, in accordance with certain embodiments.

FIG. 4 illustrates certain operations implemented in the list maintainer application 108, in accordance with certain embodiments.

Control starts at block 400, where the execution of the list maintainer application 108 is initiated. From block 400, control proceeds in parallel to block 402 and 406.

The list maintainer application 108 coalesces (at block 402) write addresses that include logical block addresses and counts of cached writes that are contiguous or overlapping. As a result, the list maintainer application 108 creates the list 110 of non-overlapped logical block addresses and associated counts. For example, a write to LBA=3 with count=4, and a later write to LBA=5 with count=8, may be coalesced into a single address with LBA=3 with count=10 since two of the data blocks overlap. This effectively reduces the verification of two or more writes whose logical block addresses and associated counts are either contiguous or overlapping into a single read. In alternative embodiments, two or more nearly contiguous writes may also be coalesced. The result of block 402 is a reduced list of logical block addresses and counts that have no overlaps.

The list maintainer application 108 reorders (at block 404) the ordered list 110 to improve the performance of subsequent reads from the disk drive 102. For example, in certain embodiments the ordered list 110 may rank the logical block addresses based on the associated count sizes and based on the number of logical block addresses that fall on the same track.

At block 406, the list maintainer application 108 receives the status 208 notification from the CVST application. Based on the received status 208 notification, the list maintainer application 108 may add (at block 408) new host write logical block addresses and counts into the ordered list 110. The list maintainer application 108 may also delete the list of logical block addresses that have been executed by the CVST application 112, where the data corresponding to the logical block addresses stored in the cache have successfully matched the data that was written to the disks 118.

Therefore, FIG. 4 illustrates certain embodiments in which the list maintainer application 108 maintains an ordered list of non-overlapping logical block addresses and associated counts to improve the performance of subsequent reads from the disk drive 102.

Figure 5:
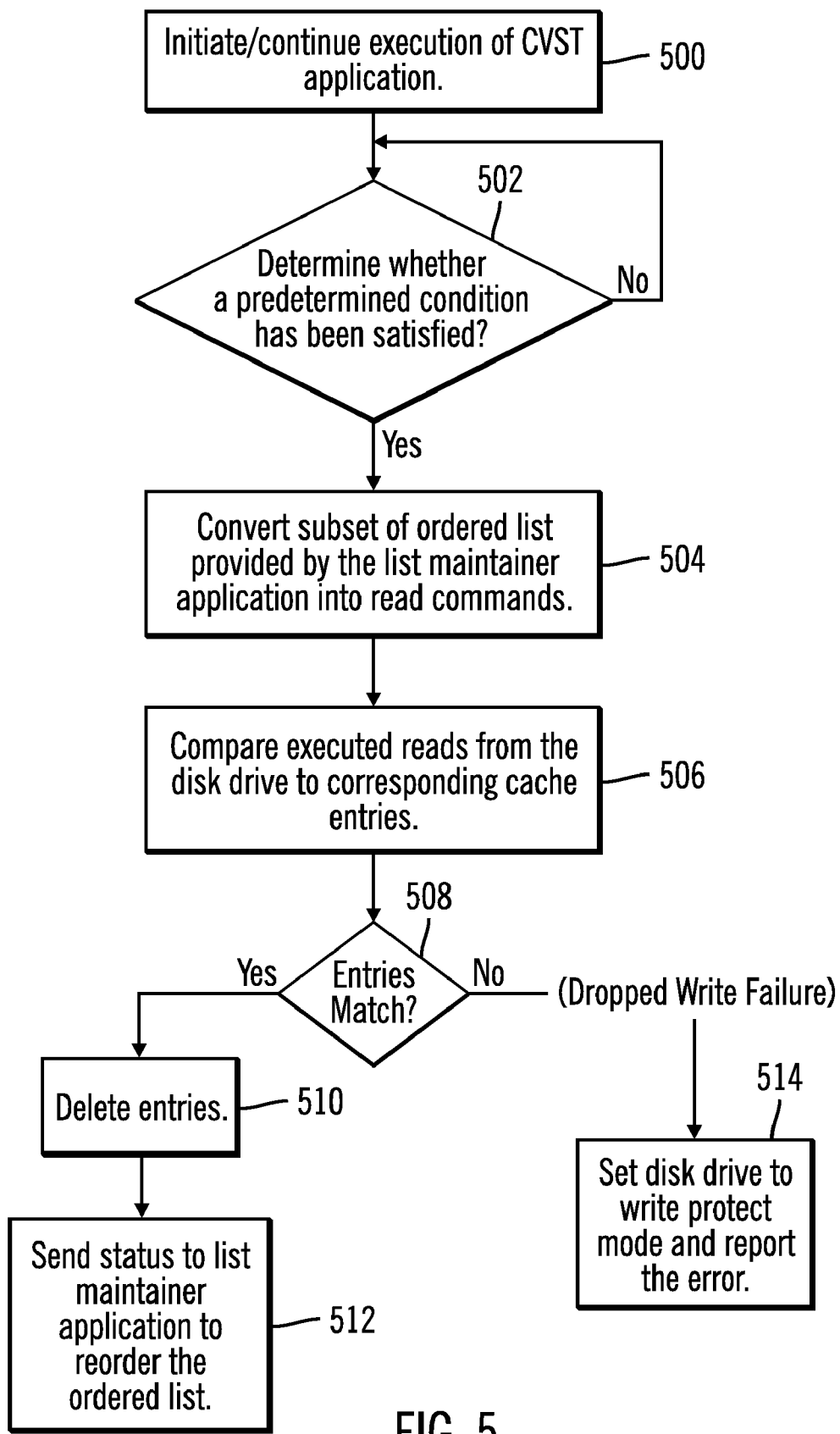
FIG. 5 illustrates operations implemented in a comprehensive verification self test application, in accordance with certain embodiments.

FIG. 5 illustrates operations implemented in the CVST application 112, in accordance with certain embodiments.

Control starts at block 500, where the CVST application 112 is initiated. The CVST application 112 determines (at block 502) whether a predetermined condition 114 has been satisfied. The predetermined conditions may determine a size of the entries to be selected by the CVST application 112 from the ordered list 110.

If the CVST application 112 determines (at block 502) that a predetermined condition 114 has been satisfied then the CVST application 112 converts (at block 504) a subset 200 of the ordered list 110 provided by the list maintainer application 108 into the read commands 202. Otherwise, the CVST application 112 keeps determining (at block 502) whether the predetermined condition has been satisfied.

The CVST application 112 compares (at block 506) executed reads from the disks 118 to corresponding cache entries that denote non-verified write data 106a in the cache 106.

At block 508, the CVST application 112 determines whether the data in the cache 108 matches the data written to the disks 118. If so, the CVST application 112 deletes (at block 510) corresponding data from the cache 106 and sends (at block 512) a status 208 notification to the list maintainer application 108, where the list maintainer application 108 manages the modification and the reordering of the ordered list 110.

If at block 508, the CVST application 112 determines that the data in the cache 108 does not match the data written to the disks 118 for the executed reads, then the CVST application 112 sets (at block 514) the disk drive 102 to write protect mode and reports the error. When the disk drive 102 is in write protect mode no data may be written to the disks 118. The case of the write errors to the disk 118 may be determined after the disk driver 102 has been put in the write protect mode. The correct data can be recovered from the non-verified write data 106a stored in the cache 106.

The number of read commands executed in block 504 by the CVST application 112 may be determined by a plurality of predetermined conditions 114. For example, if in a first exemplary condition a host idle time is 2 sec., then the CVST application 112 may execute on 20% of the ordered list 110. In a second exemplary condition, the number of entries selected from the ordered list 110 may be based on the host workload. In a third exemplary condition, the number of entries selected from the ordered list 110 may be based on the amount of the cache 106 being used. For example, if the cache is 90% full, then the CVST application 112 may select 5% of the ordered list 110. The percentage numbers may be adjusted to optimize the performance of the reads and writes to the disk 118.

Therefore, FIG. 5 illustrates certain embodiments in which the CVST application 112 uses predetermined conditions 114 to verify whether intermittent write errors while writing to the disks 118 have occurred.

Figure 6:
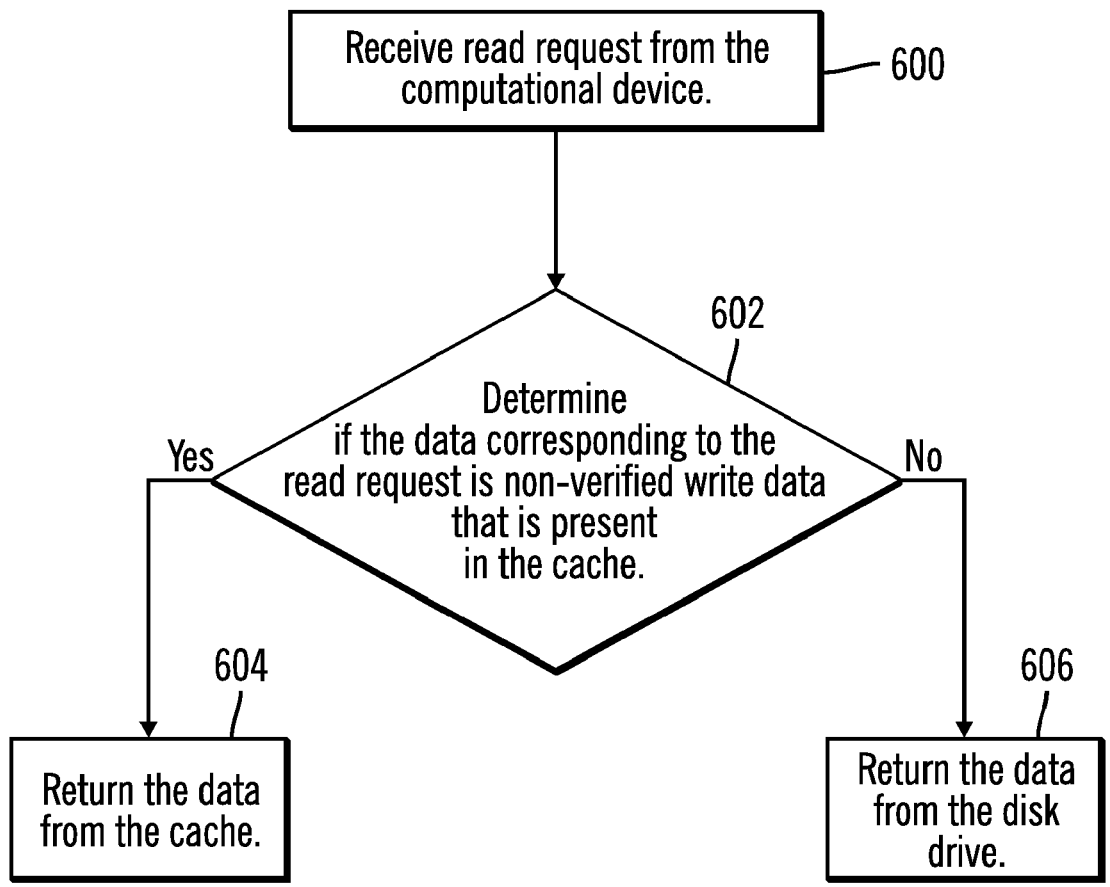
FIG. 6 illustrates operations for processing read requests, in accordance with certain embodiments.

FIG. 6 illustrates operations for processing read requests implemented in the disk drive 102, in accordance with certain embodiments.

Control starts at block 600, where the disk drive 102 receives a read request from the computational device 104. The disk drive 102 determines (at block 602) whether the data corresponding to the read request is non-verified write data 106a that is present in the cache 106. If so, then the read request is satisfied by returning (at block 604) the data from the cache 106. If not, then the read request is satisfied by returning (at block 606) the data from the disks 118.

Therefore, FIG. 6 illustrates certain embodiments in which read requests from an external host are satisfied from the cache 106 if the data corresponding to the read request is non-verified write date 106a. As a result, data returned in response to read requests are not erroneous.

Certain embodiments provide a list maintainer application 108 and a CVST application 112, where the CVST application 112 compares some of the write data in the cache 106 to the data read from the disks 118, by using an ordered list 110 provided to the CVST application 112 by the list maintainer application 108. Certain embodiments improve performance by reducing the number of writes that are stored in the cache 106. Furthermore, certain embodiments also provide protection against both intermittent and persistent dropped writes if a PPST application that implements PPST is replaced by the CVST application when the write cache 106 is nearly full.

Certain embodiments may provide full protection against persistent dropped writes by using the PPST application 116 as the dropped write check while using the list maintainer application 108 and the CVST application 112 to reduce the contents of the write cache 106 between detection phases. In this case the PPST application 116 may be invoked when the write cache 106 is nearly full and the write cached entries are flushed if there is no detected error.

In certain embodiments, the recovery of data may be executed in a background mode or in real time. Certain embodiments provide protection against any type of dropped write problems on any disk drive independent of interfaces. The dropped writes may be intermittent or persistent, and the amount of disruption to host applications may be reduced. Certain embodiments that protect against dropped writes in disk drives may not significantly impact input/output (I/O) performance.

The inclusion of the list maintainer application 108 prolongs the period during which the cache 106 reaches the almost full state and hence defers performance impacts that may be caused by the overhead of PPST or CVST verification. In certain embodiments, during a long idle cycle, the combination of CVST and PPST may flush the entire cache 106. For low host workloads, the rate of reduction may be faster than the rate of write additions from the host and this may also result in the flushing of the entire cache. Hence, in such situations the cache 106 may never get close to being full and there may be no need to run a subsequent PPST or CVST.

In certain embodiments, by simplifying the logical block addresses and associated counters, reordering entries in the ordered list 110, and sending a queue of reads to the disk 118, the process of verification is more efficient that the case where every write to the disk 118 is verified. Certain embodiments, combine overlapped writes into a single read and sends the reordered reads as a queue that allow the disk drive to further improve the read performance by optimizing the seeks to different cylinders to maximize the number of reads for a given time.

ADDITIONAL EMBODIMENT DETAILS

The described techniques may be implemented as a method, apparatus or article of manufacture involving software, firmware, micro-code, hardware and/or any combination thereof. The term "article of manufacture" as used herein refers to program instructions, code and/or logic implemented in circuitry (e.g., an integrated circuit chip, Programmable Gate Array (PGA), ASIC, etc.) and/or a computer readable medium (e.g., magnetic storage medium, such as hard disk drive, floppy disk, tape), optical storage (e.g., CD-ROM, DVD-ROM, optical disk, etc.), volatile and non-volatile memory device (e.g., Electrically Erasable Programmable Read Only Memory (EEPROM), Read Only Memory (ROM), Programmable Read Only Memory (PROM), Random Access Memory (RAM), Dynamic Random Access Memory (DRAM), Static Random Access Memory (SRAM), flash, firmware, programmable logic, etc.). Code in the computer readable medium may be accessed and executed by a machine, such as, a processor. In certain embodiments, the code in which embodiments are made may further be accessible through a transmission medium or from a file server via a network. In such cases, the article of manufacture in which the code is implemented may comprise a transmission medium, such as a network transmission line, wireless transmission media, signals propagating through space, radio waves, infrared signals, etc. Of course, those skilled in the art will recognize that many modifications may be made without departing from the scope of the embodiments, and that the article of manufacture may comprise any information bearing medium known in the art. For example, the article of manufacture comprises a storage medium having stored therein instructions that when executed by a machine results in operations being performed.

Figure 7:
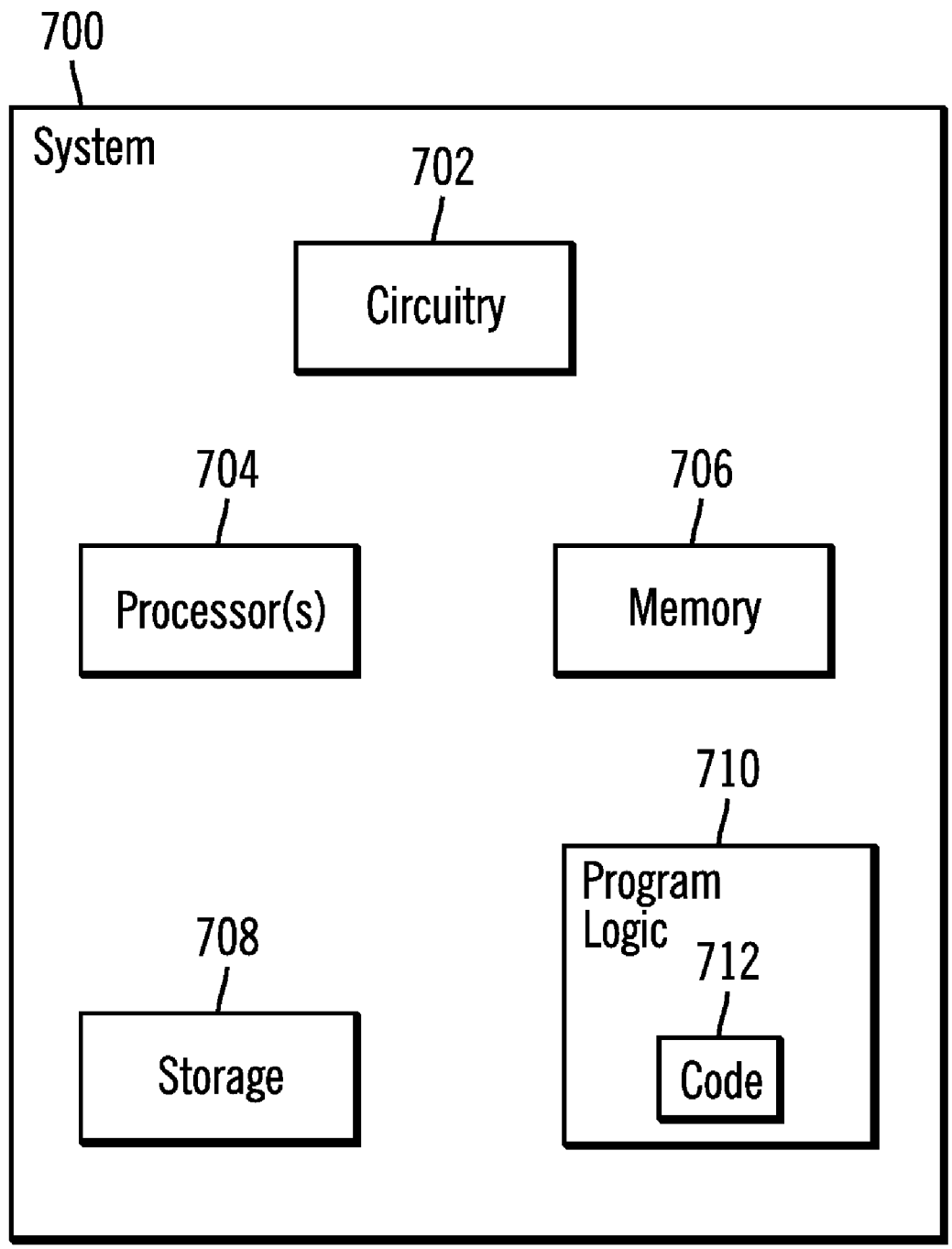
FIG. 7 illustrates a system in which certain embodiments are implemented.

FIG. 7 illustrates a block diagram of a system 700 in which certain embodiments may be implemented. In certain embodiments, the computational device 102 and the storage device 104 may be implemented in accordance with the system 700. The system 700 may include a circuitry 702 that may in certain embodiments include a processor 704. The system 700 may also include a memory 706 (e.g., a volatile memory device), and storage 708. Certain elements of the system 700 may or may not be found in some or all of the computational device 102 and storage device 104. The storage 708 may include a non-volatile memory device (e.g., EEPROM, ROM, PROM, RAM, DRAM, SRAM, flash, firmware, programmable logic, etc.), magnetic disk drive, optical disk drive, tape drive, etc. The storage 708 may comprise an internal storage device, an attached storage device and/or a network accessible storage device. The system 700 may include a program logic 710 including code 712 that may be loaded into the memory 706 and executed by the processor 704 or circuitry 702. In certain embodiments, the program logic 710 including code 712 may be stored in the storage 708. In certain other embodiments, the program logic 710 may be implemented in the circuitry 702. Therefore, while FIG. 7 shows the program logic 710 separately from the other elements, the program logic 710 may be implemented in the memory 706 and/or the circuitry 702.

Certain embodiments may be directed to a method for deploying computing instruction by a person or automated processing integrating computer-readable code into a computing system, wherein the code in combination with the computing system is enabled to perform the operations of the described embodiments.

At least certain of the operations illustrated in FIGS. 3-6 may be performed in parallel as well as sequentially. In alternative embodiments, certain of the operations may be performed in a different order, modified or removed.

Furthermore, many of the software and hardware components have been described in separate modules for purposes of illustration. Such components may be integrated into a fewer number of components or divided into a larger number of components. Additionally, certain operations described as performed by a specific component may be performed by other components.

The data structures and components shown or referred to in FIGS. 1-7 are described as having specific types of information. In alternative embodiments, the data structures and components may be structured differently and have fewer, more or different fields or different functions than those shown or referred to in the figures. Therefore, the foregoing description of the embodiments has been presented for the purposes of illustration and description. It is not intended to be exhaustive or to limit the embodiments to the precise form disclosed. Many modifications and variations are possible in light of the above teaching.

What is claimed is:

1. A computer readable storage including code, wherein the code when executed by a computer performs operations, the operations comprising:
   receiving a request to write data to a storage medium;
   storing in a cache, the data requested to be written to the storage medium;
   initiating a writing of the data to the storage medium; and
   periodically determining whether the stored data in the cache is same as the data written to the storage medium, wherein writes to the storage medium are performed in one order, and verification of the writes to the storage medium are performed in a different order.

2. The computer readable storage of claim 1, the operations further comprising:
   write protecting the storage medium, in response to determining that the stored data in the cache is not the same as the data written to the storage medium; and
   generating an error that indicates at least one dropped write to the storage medium.

3. The computer readable storage of claim 1, the operations further comprising:
   determining whether a number of entries in the cache exceeds a threshold, wherein the entries correspond to cached writes;
   coalescing write addresses in the entries to generate a list of the coalesced write addresses; and
   ordering the list of coalesced write addresses, wherein higher ordered coalesced write addresses are verified for write errors to the storage medium before lower ordered coalesced write addresses.

4. A system, comprising:
   memory;
   a storage medium coupled to the memory;
   a cache coupled to the memory; and
   a processor coupled to the memory, wherein the processor is operable to:
      receive a request to write data to the storage medium;
      store in the cache, the data requested to be written to the storage medium;
      initiate a writing of the data to the storage medium; and
      periodically determine whether the stored data in the cache is same as the data written to the storage medium, wherein writes to the storage medium are performed in one order, and verification of the writes to the storage medium are performed in a different order.

5. The system of claim 4, wherein the processor is further operable to:
   write protect the storage medium, in response to determining that the stored data in the cache is not the same as the data written to the storage medium; and
   generate an error that indicates at least one dropped write to the storage medium.

6. The system of claim 4, wherein the processor is further operable to:
   determine whether a number of entries in the cache exceeds a threshold, wherein the entries correspond to cached writes;
   coalesce write addresses in the entries to generate a list of the coalesced write addresses; and
   order the list of coalesced write addresses, wherein higher ordered coalesced write addresses are verified for write errors to the storage medium before lower ordered coalesced write addresses.

7. A system, comprising:
   a storage medium;
   a cache coupled to the storage medium;
   means for receiving a request to write data to the storage medium;
   means for storing in the cache, the data requested to be written to the storage medium;
   means for initiating a writing of the data to the storage medium; and
   means for periodically determining whether the stored data in the cache is same as the data written to the storage medium, wherein writes to the storage medium are performed in one order, and verification of the writes to the storage medium are performed in a different order.

8. The system of claim 7, further comprising:
   means for write protecting the storage medium, in response to determining that the stored data in the cache is not the same as the data written to the storage medium; and
   means for generating an error that indicates at least one dropped write to the storage medium.

9. The system of claim 7, further comprising:
   means for determining whether a number of entries in the cache exceeds a threshold, wherein the entries correspond to cached writes;
   means for coalescing write addresses in the entries to generate a list of the coalesced write addresses; and
   means for ordering the list of coalesced write addresses, wherein higher ordered coalesced write addresses are verified for write errors to the storage medium before lower ordered coalesced write addresses.

10. A computer readable storage including code, wherein the code when executed by a computer performs operations, the operations comprising:
    receiving a request to write data to a storage medium;
    storing in a cache, the data requested to be written to the storage medium;
    initiating a writing of the data to the storage medium; and
    periodically determining whether the stored data in the cache is same as the data written to the storage medium, the operations further comprising:
       determining whether a number of entries in the cache exceeds a threshold, wherein the entries correspond to cached writes; and
       coalescing write addresses in the entries to generate a list of the coalesced write addresses that are verified for write errors to the storage medium.

11. A method, comprising:
    receiving a request to write data to a storage medium;
    storing in a cache, the data requested to be written to the storage medium;
    initiating a writing of the data to the storage medium; and
    periodically determining whether the stored data in the cache is same as the data written to the storage medium, the method further comprising:
       determining whether a number of entries in the cache exceeds a threshold, wherein the entries correspond to cached writes; and coalescing write addresses in the entries to generate a list of the coalesced write addresses that are verified for write errors to the storage medium.

12. The method of claim 11, the method further comprising:

write protecting the storage medium, in response to determining that the stored data in the cache is not the same as the data written to the storage medium; and generating an error that indicates at least one dropped write to the storage medium.

13. A system, comprising:

memory;

a storage medium coupled to the memory;

a cache coupled to the memory; and a processor coupled to the memory, wherein the processor is operable to:

receive a request to write data to the storage medium;

store in the cache, the data requested to be written to the storage medium;

initiate a writing of the data to the storage medium; and periodically determine whether the stored data in the cache is same as the data written to the storage medium, wherein the processor is further operable to:

determining whether a number of entries in the cache exceeds a threshold, wherein the entries correspond to cached writes; and coalescing write addresses in the entries to generate a list of the coalesced write addresses that are verified for write errors to the storage medium.

14. A system, comprising:

a storage medium;

a cache coupled to the storage medium;

means for receiving a request to write data to the storage medium;

means for storing in the cache, the data requested to be written to the storage medium;

means for initiating a writing of the data to the storage medium;

means for periodically determining whether the stored data in the cache is same as the data written to the storage medium;

means for determining whether a number of entries in the cache exceeds a threshold, wherein the entries correspond to cached writes; and means for coalescing write addresses in the entries to generate a list of the coalesced write addresses that are verified for write errors to the storage medium.

* * * * *